United States Patent

Hutter et al.

[11] Patent Number: 6,153,451
[45] Date of Patent: Nov. 28, 2000

[54] TRANSISTOR WITH INCREASED OPERATING VOLTAGE AND METHOD OF FABRICATION

[75] Inventors: Louis N. Hutter, Richardson; John P. Erdeljac; Jeffrey P. Smith, both of Plano, all of Tex.

[73] Assignee: Texas Instruments Incorporated, Dallas, Tex.

[21] Appl. No.: 09/002,977

[22] Filed: Jan. 5, 1998

Related U.S. Application Data

[60] Provisional application No. 60/035,768, Jan. 6, 1997.

[51] Int. Cl.[7] .................................................. H01L 21/366
[52] U.S. Cl. ........................ 438/197; 438/138; 438/268; 438/269
[58] Field of Search ..................................... 438/197, 268, 438/269, 138, 298, 372, 374, 376, 326, 527, 529; 257/328, 329, 335

[56] References Cited

U.S. PATENT DOCUMENTS

| | | | |
|---|---|---|---|
| 4,794,432 | 12/1988 | Yilmaz et al. ............................. | 357/86 |
| 5,171,699 | 12/1992 | Hutter et al. ............................. | 438/268 |
| 5,436,179 | 7/1995 | Erdeljac et al. .......................... | 437/31 |
| 5,585,294 | 12/1996 | Smayling et al. ....................... | 438/268 |
| 5,719,421 | 2/1998 | Hutter et al. ............................. | 257/335 |
| 5,728,593 | 3/1998 | Yun et al. ................................ | 438/138 |

*Primary Examiner*—Michael Trinh
*Attorney, Agent, or Firm*—Wade James Brady, III; Frederick J. Telecky, Jr.

[57] ABSTRACT

A method for increasing the operating voltage of a transistor formed on a substrate of a first conductivity region of a second conductivity type in a surface of the substrate. An N-well adjust region of the first conductivity type is then formed in the N-well region. The N-well adjust region extends to a first depth in the N-well region. A double diffusion well of the first conductivity type is then formed in the N-well. The double diffusion well extends to a second depth greater than the first depth of the N-well adjust region, and contains a portion of the N-well. Two N- channel stop regions are then formed in the N-well. The two N-channel stop regions extending to a third depth greater than the depth of the N-well adjust region, and contain a portion of the N-well.

9 Claims, 7 Drawing Sheets

TRANSISTOR WITH INCREASED OPERATING VOLTAGE AND METHOD OF FABRICATION

This application claims priority under 35 USC §119 (e) (1) of provisional application number 60/035,768 filed Jan. 6, 1997.

TECHNICAL FIELD OF THE INVENTION

This invention relates in general to semiconductor devices, and in particular to a transistor with increased operating voltage and method of fabrication.

BACKGROUND OF THE INVENTION

Metal oxide substrate (MOS) transistors that are fabricated using double diffusion layers may be used in integrated circuit applications with high power requirements. In particular, double diffusion metal oxide substrate (DMOS) transistors are useful because of their ability to have a large OFF state blocking voltage ($BV_{dss}$). A large OFF state blocking voltage is useful in power applications to protect the transistor from the effects of surge voltages, such as from switching transients.

Nevertheless, increasing the OFF state blocking voltage for conventional DMOS devices usually includes changes to manufacturing process steps in the transistor fabrication process. These manufacturing process steps are commonly shared with non-DMOS components. Therefore, changes to the manufacturing process steps for manufacturing DMOS components may affect the non-DMOS components and cause significant problems with the construction and operation of these non-DMOS components.

In addition, adding manufacturing process steps to the manufacturing processes for such devices increases the manufacturing cost. Additional costs may also be incurred in resolving any problems that may be caused with the construction and operation of the non-DMOS components. These additional costs may cause the cost of producing integrated circuit packages containing DMOS components with large OFF state blocking voltages to be prohibitive.

SUMMARY OF THE INVENTION

Therefore a need has arisen for a method for increasing the operating voltage of a transistor that addresses shortcomings of the prior methods for increasing the operating voltage of transistors.

In particular, a method for increasing the OFF state blocking voltage of a DMOS transistor is needed that does not add manufacturing steps to the DMOS manufacturing process that adversely affect non-DMOS devices, and that does not result in a significant increase in the cost of manufacturing the DMOS transistors.

In accordance with the present invention, a method for increasing the operating voltage of a transistor formed on a substrate of a first conductivity type is provided that includes forming an N-well region of a second conductivity region of the first conductivity type is then formed in the N-well region. The N-well adjust region extends to a first depth in the N-well region. A double diffusion well of the first conductivity type is then formed in the N-well. The double diffusion well extends to a second depth greater than the first depth of the N-well adjust region, and contains a portion of the N-well. Two N- channel regions are then formed in the N-well. The two N- channel stop regions extending to a third depth greater than the depth of the N-well adjust region, and contain a portion of the N-well.

The present invention provides many important technical advantages. One important technical advantage of the present invention is a method for increasing the OFF state blocking voltage for DMOS components that does not add manufacturing process steps that affect non-DMOS components. Thus, the OFF state blocking voltage for DMOS devices may be increased without causing significant problems with the construction and operation of non-DMOS components.

Another important technical advantage of the present invention is a method for increasing the OFF state blocking voltage for DMOS components that does not significantly increases the manufacturing cost of integrated circuit packages containing the DMOS components.

BRIEF DESCRIPTION OF THE DRAWINGS

For a more complete understanding of the present invention and advantages thereof, reference is now made to the following descriptions taken in conjunction with the accompanying drawings in which like reference numbers indicate like features and wherein.

DETAILED DESCRIPTION OF THE INVENTION

Preferred embodiments of the present invention are illustrated in the FIGURES, like numerals being used to refer to like and corresponding parts of the various drawings.

TABLE 1 shows the major process steps in a known baseline process flow for manufacturing bipolar junction devices and complementary metal oxide substrate devices (BiCMOS), with additional steps for increasing the operating voltage of a DMOS transistor. This baseline process flow outlines a known CMOS-driven BiCMOS process where the high-temperature bipolar junction device processing steps are performed prior to the DMOS implant steps. The present invention advantageously does not disturb or alter the baseline process flow.

TABLE 1

Standard BiCMOS Process Flow with
DMOS Off-Voltage Adjust

| 1 Material Start | 19 Gate Oxide 1 |
| 2 First Epitaxial Layer | 20 VT Adjust (Mask) |
| 3 Buried Layer (Mask) | 21 Poly-1 (Mask) |
| 4 Second Epitaxial Layer | 22 ILO/ILN |
| 5 Nwell (Mask) | 23 Poly-2 (Mask) |

TABLE 1-continued

Standard BiCMOS Process Flow with
DMOS Off-Voltage Adjust

| | |
|---|---|
| 6 N+ Collector Deposition (Mask) | 24 N-S/D (Mask) |
| 7 NWELL ADJUST PATTERN (MASK) | 25 Sidewall |
| 8 NWELL ADJUST ETCH | 26 N+S/D (Mask) |
| 9 NWELL ADJUST IMPLANT | 27 P+S/D (Mask) |
| 10 TEOS DEPOSITION | 28 Emitter (Mask) |
| 11 N+ Collector Diffusion | 29 MLO Deposition |
| 12 DMOS Pattern (Mask) | 30 Contact (Mask) |
| 13 D-Well Implant | 31 Silicide |
| 14 N Source | 32 Metal-1 (Mask) |
| 15 D-Well Diffusion | 33 Interlevel Oxide |
| 16 Base (Mask) | 34 Via (Mask) |
| 17 Moat (Mask) | 35 Metal-2 (Mask) |
| 18 Channel Stop (Mask) | 36 PO (mask) |

The steps implementing the higher voltage DMOS transistor are shown in steps seven through ten of Table 1. After the ion implantation of the N-well dopant material, a mask for the N-well adjust material is formed on the surface of the N-well. The N-well adjust region mask may cover the entire N-well, or may cover predetermined areas of the N-well, as suitable. The N-well adjust region is then formed by ion implantation. AS shown in Table 1, is addition of steps seven through ten does not result in any additional processing steps for steps eight through thirty-six to implement changes to non DMOS devices affected by steps seven through ten, and likewise does not required any additional processing prior to step seven.

Figure 1:
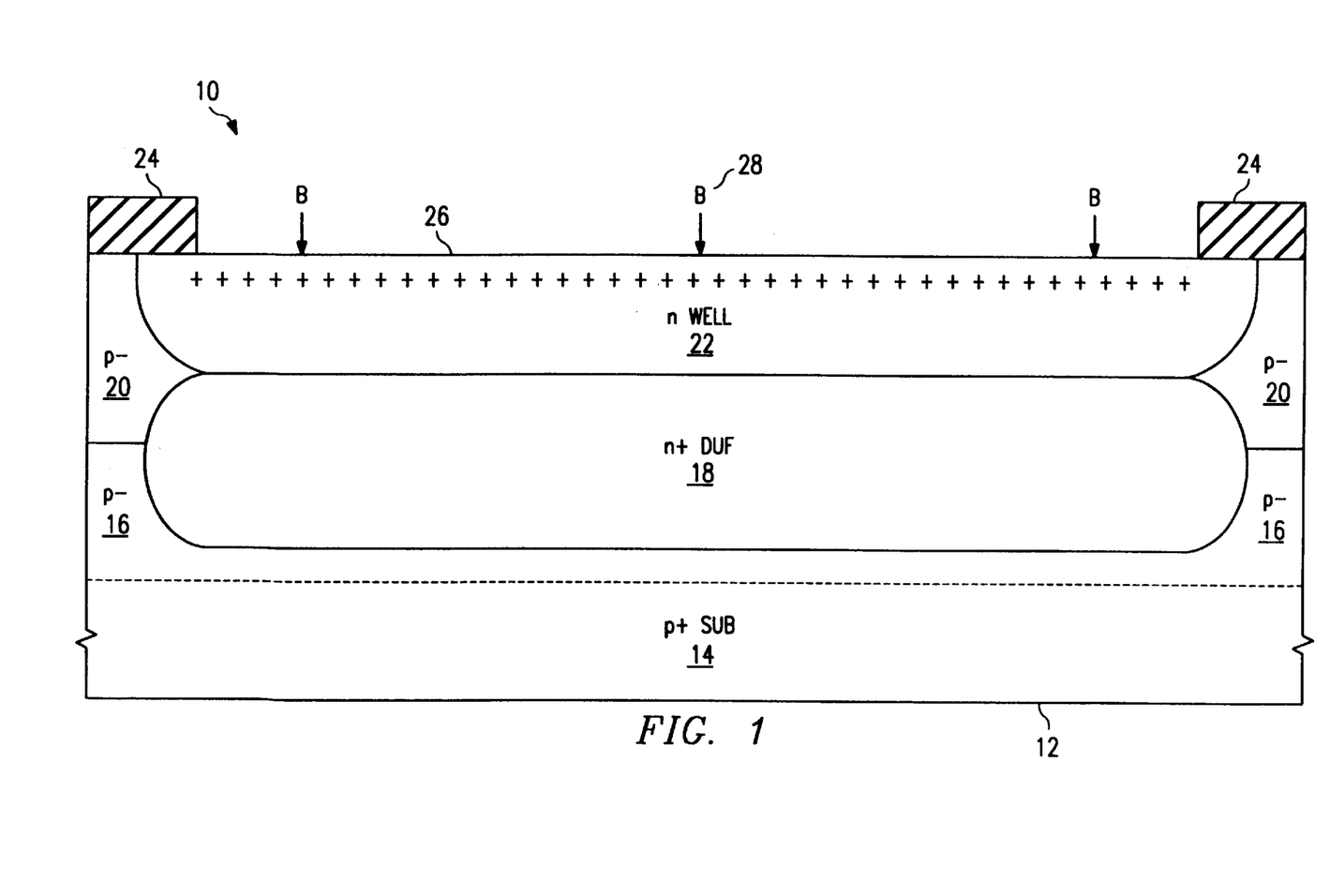
FIG. 1 shows a cross-section of a high voltage DMOS device embodying concepts of the present invention.

FIG. 1 shows a cross-section 10 of a high voltage DMOS device 12 embodying concepts of the present invention. DMOS device 12 includes a P+ substrate 14 (P+ SUB), which is typically a heavily doped P+ type silicon that is doped with material of a first conductivity type, such as boron. A P− epitaxial layer 16 is disposed on P+ substrate 14, and is typically a lightly doped P− type silicon that is grown by vapor phase epitaxy, liquid metal epitaxy, or other suitable methods. An oxide layer (not explicitly shown) is then formed and patterned for ion implantation if a material having a second conductivity type, such as phosphorus, antimony, or arsenic. This implant forms N+ diffusion layer 18 (N+ DUF).

Following the implantation of N+ diffusion layer 18, the oxide layer is stripped and a second P− epitaxial layer 20 is grown on P− epitaxial layer 16 and N+ diffusion layer 18 by vapor phase epitaxy, liquid metal epitaxy, or other suitable methods, Second P− type silicon. N-well 22 (n WELL) is then formed by ion implantation of an N-type material After N-well 22 has been ion implanted and diffused, an N-well adjust resist layer 24 is formed on the surface of N-well 22. N-well adjust resist mask 24 is used to define the area in which an N-well adjust doping implant will be added to the high voltage DMOS device 12, such as is shown in step seven of Table 1.

After oxide mask 24 has been applied, it is etched to expose silicon surface 26, in accordance with step eight of the method described in Table 1. Silicon surface 26 of N-well 22 is implanted with a P-type material implant, such as boron as shown id FIG. 1, in accordance with step nine of Table 1. For example, the boron may be ion implanted at an energy level of 100 keV and a dopant density of $3.5 \times 10^{12}$ atoms/cm$^2$. The boron implant crates the N-well 22 doping adjust region.

Figure 2:
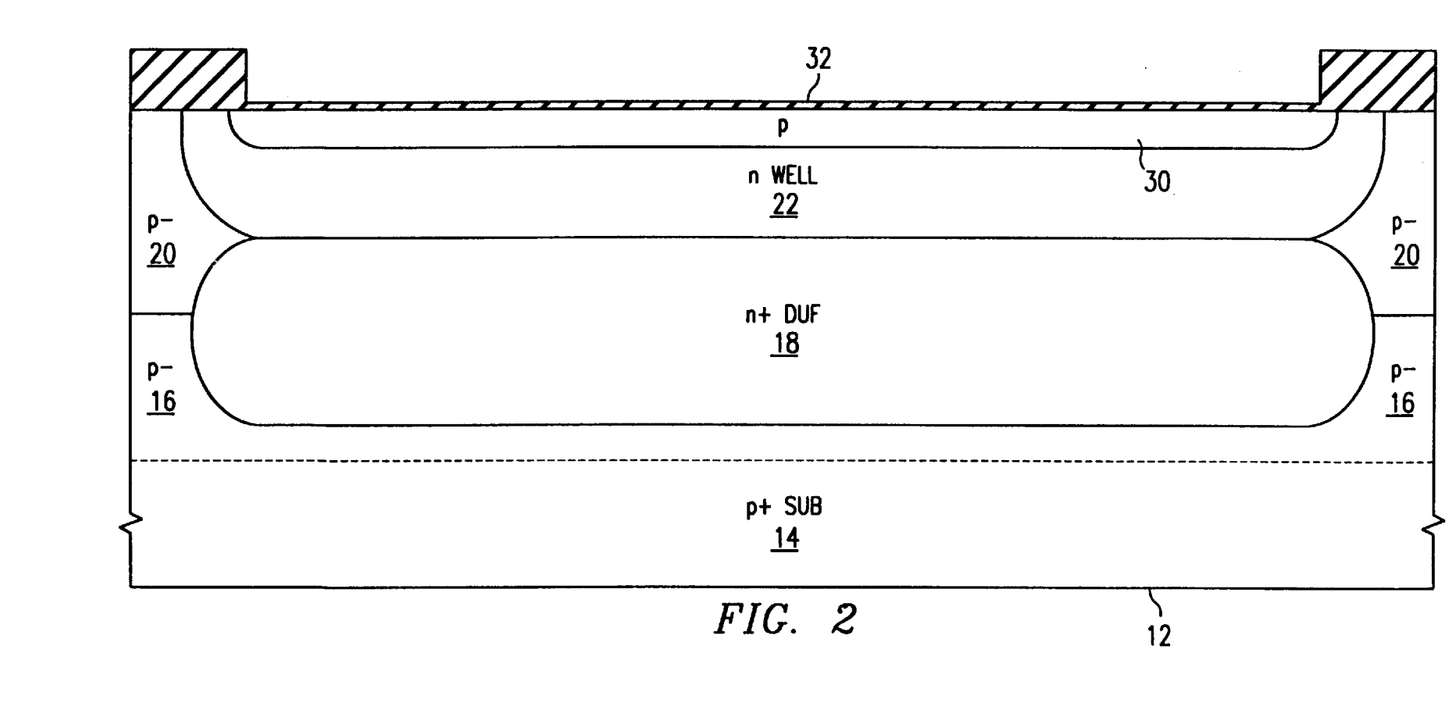
FIG. 2 shows a cross-section of the high voltage DMOS device embodying concepts of the present invention.

FIG. 2 shows a cross-section of high voltage DMOS device 12 after the formation of an oxide layer. N-well adjust region 30 has been diffused into N-well 22, such as by heating high voltage DMOS device 12. Following the diffusion of N-well adjust region 30, oxide layer 32 is formed on high voltage DMOS device 12, such as is shown in step ten of Table 1. Oxide layer 32 may be grown by sing a solution of tetraethoxysilane (TEOS), which is sold by, for example, Allied Signal Corp., of Morristown, N.J.

Alternatively, oxide layer 32 may be formed by local oxidation of substrate techniques or other suitable methods, Oxide layer 32 is preferably 500–3,000 angstroms thick, and prevent autodoping of N-well adjust region 30 from nearby heavily doped N+ collector regions of high voltage DMOS device 12.

Following the creation of oxide layer 32, normal N+ collector diffusion is then performed. For example, N+ collector diffusion may be performed for 40 minutes at 1200° C. The N+ collector diffusion step causes the N+ collector regions (not explicitly shown) to diffuse for NPN transistors, completes the diffusion of N-well 22, and causes N-well adjust region 30 to diffuse into N-well 22.

Figure 3:
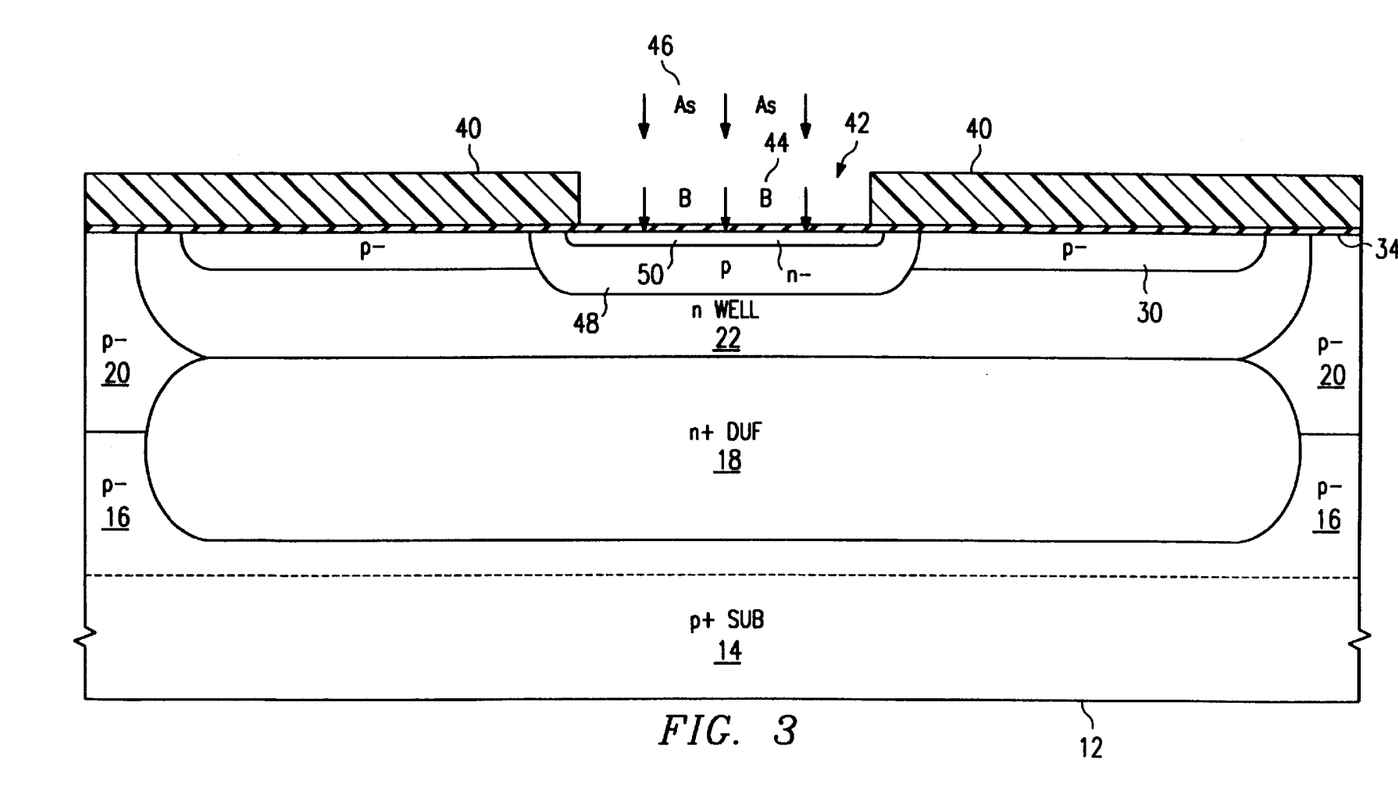
FIG. 3 shows a cross-section of the high voltage DMOS device after creation of the N-well doping adjust region.

FIG. 3 shows a cross-section of high voltage DMOS device 12 after creation of the double diffusion well (D-well). First, oxide layer 32 is removed from surface 26, and D-well pad oxide layer 34 is thermally grown or formed by other suitable methods, such as local oxidation of substrate techniques. A D-well resist layer 40 is formed over D-well pad oxide layer 34 and forms D-well implant channel 42.

Boron 44 is then ion implanted at an energy level of 50 keV and a dopant concentration of $8.5 \times 10^{13}$ atoms/cm$^2$ to form D-well 48. D-well 48 diffuses through N-well adjust region 30 and into N-well 48 diffuses through N-well adjust is ion implanted at an energy level of 150 keV and a dopant concentration of approximately $1.0 \times 10^{14}$ atoms/cm$^2$ to form N source 50. N source 50 diffuses into N-well adjust region 30. Diffusion of D-well 48 and N source 50 is preferably performed at a preferable temperature of approximately 110° C.

Figure 4:
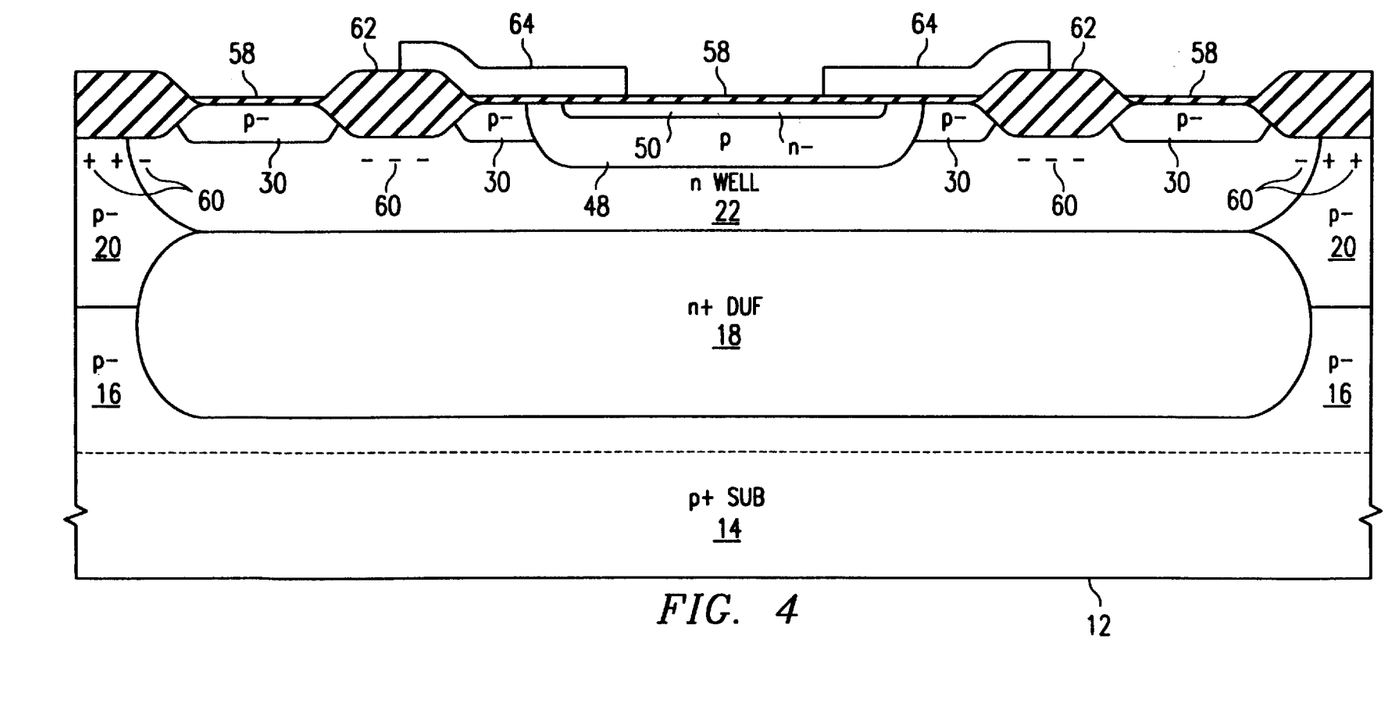
FIG. 4 shows a cross-section of the high voltage DMOS device after creation of a gate region extending into N-well doping adjust region.

FIG. 4 shows a cross-section of high voltage DMOS device 12 after the creation of a gate region extending into N-well doping adjust region 30. D-well pad oxide layer 34 is first removed, which completes all DMOS-specific processing. A pad oxide layer and passivation layer (not explicitly shown), such as low pressure chemical vapor deposition silicon nitride, is used to mask the areas of the substrate that will receive channel stop regions 60. Channel stop regions 60 are then formed by ion implantation of phosphorus into N-well 22 and boron into p− epitaxial layer 20, respectively.

Field oxide regions 62 are then formed by standard local oxidation of substrate techniques, or by other suitable methods. The pad oxide layer and passivation layer are then removed, and a gate oxide layer 58 is then formed by a suitable method, such as by thermal growth. Gate oxide layer 58 preferably has a thickness of approximately 425 angstroms. Polycrystalline silicon layers 64 are then formed on field oxide regions 62 and gate oxide regions 64, overlapping D-well 48 and N source 50. Polycrystalline silicon layers 64 preferably have a thickness of 5000 angstroms, and are formed by vapor deposition or other suitable methods.

After deposition, polycrystalline silicon layers 64 are doped to a resistance of 20 ohms/square, are patterned, and are etched to form the high voltage DMOS gate electrodes. This step is performed simultaneously with the formation of gate electrodes for CMOS transistors on the same chip (not explicitly shown).

Figure 5:
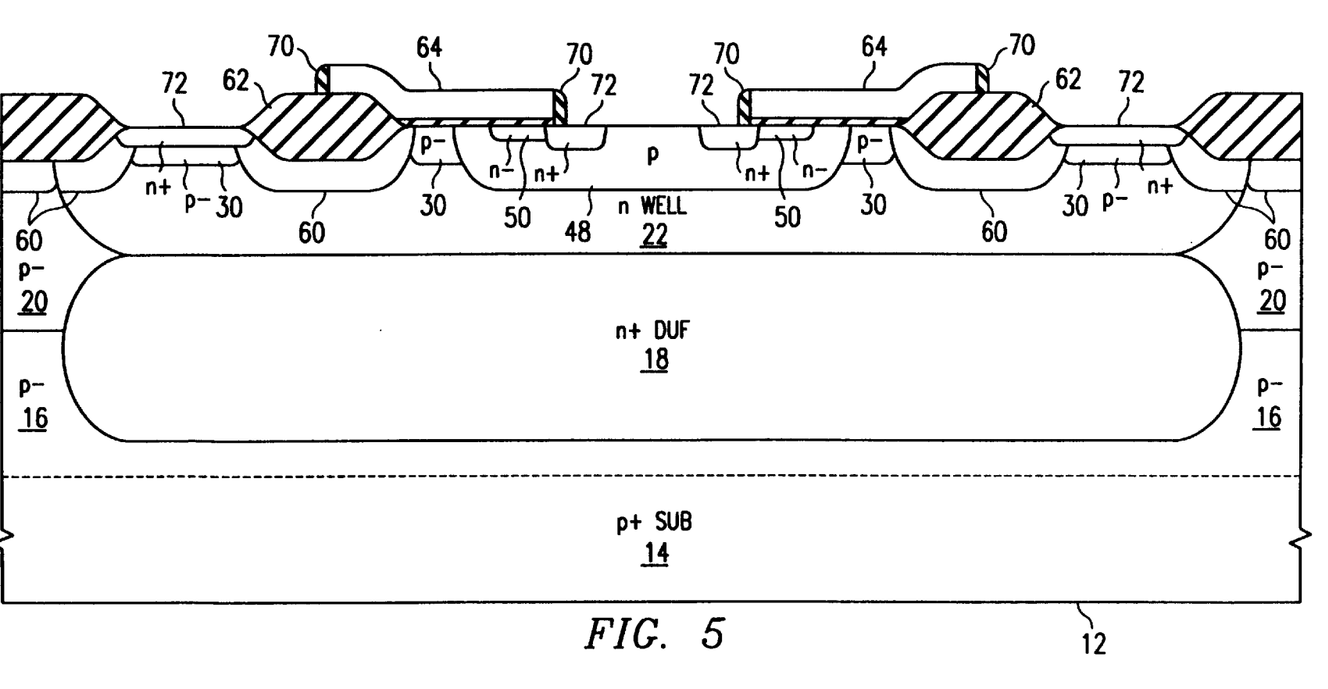
FIG. 5 shows a cross-section of the high voltage DMOS device after formation of sidewalk spacers.

FIG. 5 shows a cross-section of high voltage DMOS device 12 after formation of sidewalk spacers. Sidewalk spacers 70 are formed on the polycrystalline silicon layers 64, and the N+ source and drain resist pattern (not explicitly shown) is defined. Arsenic is ion implanted at an energy level of 135 keV and a dopant density of $8.0 \times 10^{15}$ to form N+ drain and source regions 72. Alternatively, the N+ drain and source regions 72 may be comprised of two ion implanted materials, such as arsenic at a dopant density of approximately $3 \times 10^{15}$ atoms/cm$^2$ and phosphorus at a dopant density of approximately $4 \times 10^{14}$ atoms/cm$^2$. The N+ source and drain regions 72 are diffused at 1000° C.

Figure 6:
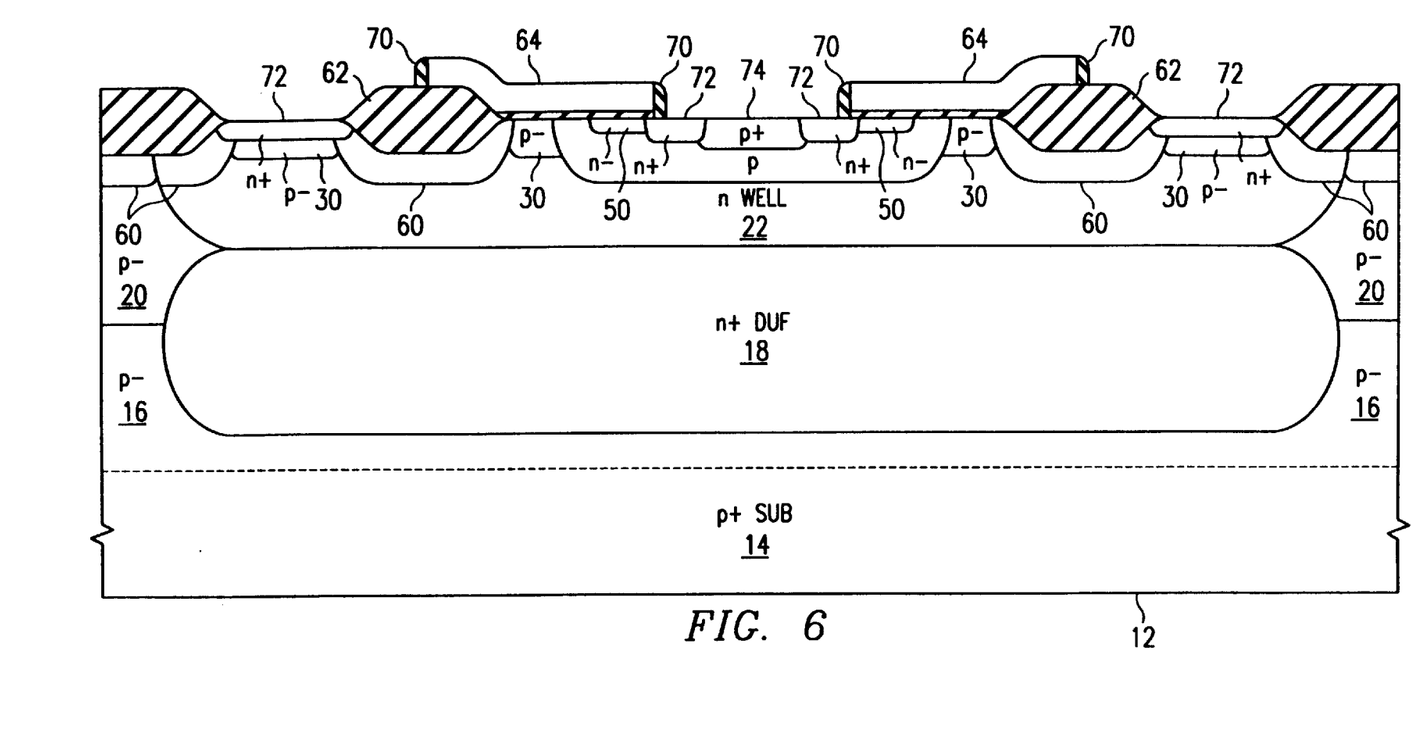
FIG. 6 shows a cross-section of the high voltage DMOS device after formation of the P+ source and drain regions.

FIG. 6 shows a cross-section of high voltage DMOS device 12 after formation of the P+ source and drain regions. First, a P+ source and drain resist pattern (not explicitly shown) is defined, and boron is ion implanted at an energy level of 40 keV to a dopant density of $4.0 \times 10^{15}$. The P+ source and drain implant is diffused to form P+ source and drain region 74.

Figure 7:
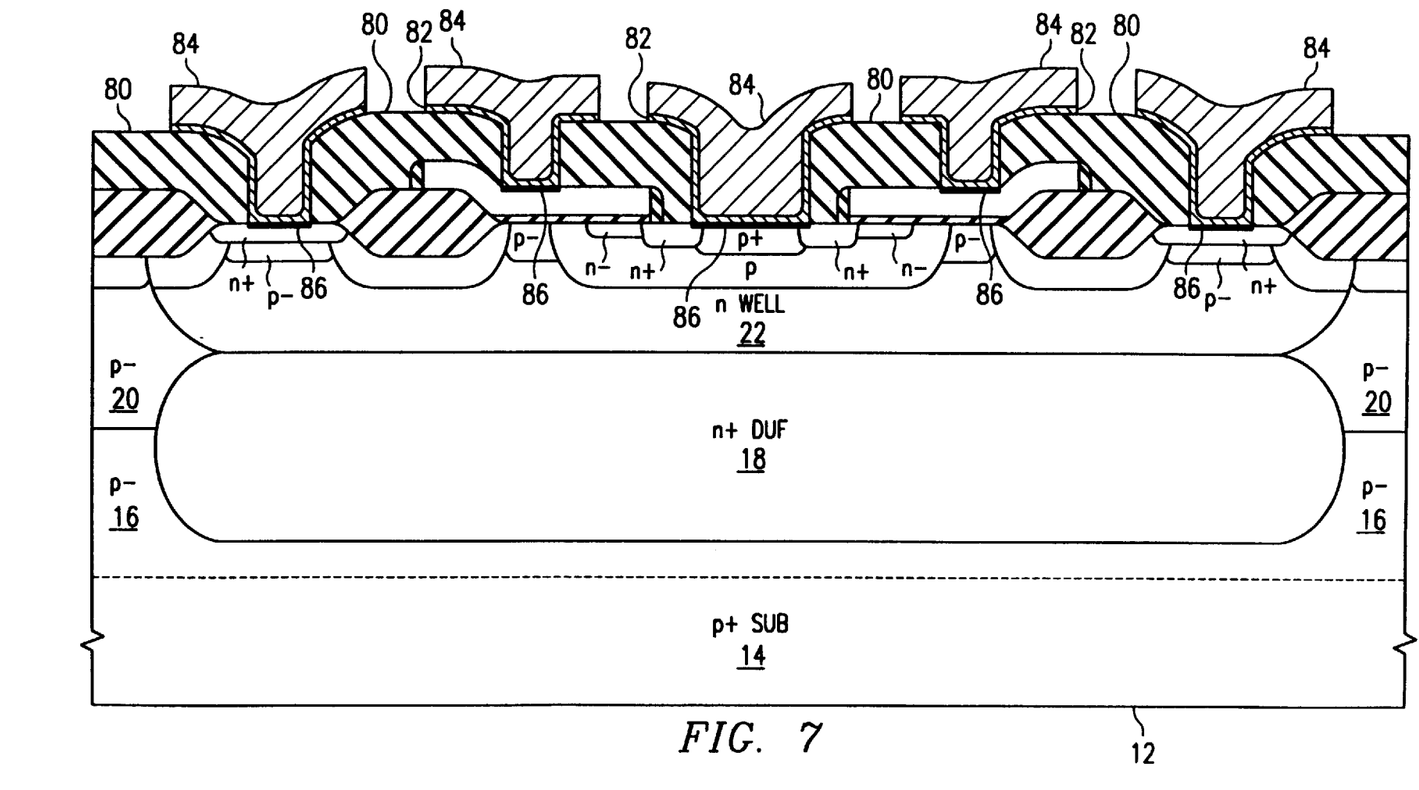
FIG. 7 shows a cross-section of the high voltage DMOS device after formation of metal contacts.

FIG. 7 shows a cross-section of high voltage DMOS device 12 after formation of metal contacts. First an oxide layer 80 is formed over high voltage DMOS device 12, and channels are formed to the drain, source, and gate contacts. Metal contacts are formed by a suitable method, such as by deposition of a layer of platinum silicon alloy 86, titanium tungsten alloy 82, and aluminum silicon copper alloy 84.

In operation, the N-well adjust region 30 of high voltage DMOS device 12 causes the electric filed gradient in the region of channel stop 60 to be minimized. When high voltage DMOS device 12 is exposed to an OFF-state blocking voltage, the electric field gradient created by N-well adjust region 30 allows high voltage DMOS device 12 to be exposed to higher voltages than if N-well adjust region 30 were not present.

The present invention provides many important technical advantages. One important technical advantage of the present invention is a method for increasing the OFF-state blocking voltage for DMOS components that does not add manufacturing process steps that affect non-DMOS components. Thus, the OFF state blocking voltage for DMOS devices may be increased without causing significant problems with the construction and operation of non-DMOS components. Another important technical advantage of the present invention is a method for increasing the OFF state blocking voltage for DMOS components that does not significantly increases the manufacturing cost of integrated circuit packages containing the DMOS components.

Although the present invention has been described in detail, it should be understood that various changes, substitutions, and alterations may be made hereto without departing from the spirit and the scope of the invention as defined by the appended claims. For example, the thicknesses of various layers of materials, where provided, are exemplary or representative of a best mode and are not required unless explicitly state otherwise.

What is claimed is:

1. A method for forming a DMOS transistor on a substrate of a first conductivity type, comprising the steps of:

forming a well of a second conductivity type in a surface of the substrate, the well extending to a first depth;

forming a doping adjust region of the first conductivity type in the surface of the substrate, the doping adjust region extending to a second depth that is less than the first depth;

forming a gate region of the first conductivity type in the doping adjust region and the substrate, the gate region extending to a third depth less than the first depth and greater than the second depth, the gate region containing a portion of the doping adjust region of the first conductivity type and the well of the second conductivity type;

forming a first channel stop region and a second channel stop region of the first conductivity type in the doping adjust region and the substrate, the first channel stop and second channel stop extending to a fourth depth less than the first depth and greater than the second depth, the first channel stop and second channel stop containing a portion of the doping adjust region of the first conductivity type and the well of the second conductivity type;

forming first and second source/drain regions of the second conductivity type in the doping adjust region, the first and second source/drain regions extending to a depth less than the second depth, the first channel stop region being located between the gate region and the first source/drain region and the second channel stop region being located between the gate region and the second source/drain regions; and forming third and fourth source/drain regions of the second conductivity type in the gate region, the third and fourth source/drain regions extending to a depth less than the third depth.

2. The method of claim 1 wherein the step of forming the first and second channel stop further comprises the steps of forming the first and second channel stop laterally adjacent to but not touching the gate region.

3. The method of claim 1 wherein the step of forming the first and second channel stop further comprises the steps of forming the first and second channel stop laterally adjacent to but not touching the gate region, wherein the first and second channel stop are on opposite sides of the gate region.

4. The method of claim 1 wherein the step of forming the doping adjust region further comprises the step of implanting an impurity of the first conductivity type into an area of the well.

5. The method of claim 1 in which the gate region is more heavily doped than the doping adjust region.

6. The method of claim 1 in which the first and second channel stop regions are more heavily doped than the well.

7. The method of claim 1 in which the doping adjust region has a dopant concentration that reduces the dopant concentration in the first and second channel stop regions adjacent to the gate region.

8. The method of claim 1, further comprising the step of forming a first field oxide region over the first channel stop region and a second field oxide region over the second channel stop region.

9. The method of claim 1, further comprising the step of forming a first gate electrode over and insulated from the doping adjust region and the gate region located between the first channel stop region and the first source region and a second gate electrode over and insulated from the doping adjust region and the gate region located between the second channel stop region and the second source region.

* * * * *